(12) United States Patent
Ban et al.

(10) Patent No.: US 11,706,963 B2
(45) Date of Patent: Jul. 18, 2023

(54) DISPLAY PANEL AND LARGE DISPLAY APPARATUS HAVING THE SAME

(71) Applicant: LG Display Co., Ltd., Seoul (KR)

(72) Inventors: MyungHo Ban, Paju-si (KR); Dongik Kim, Paju-si (KR); Subin Kim, Paju-si (KR); BumSik Kim, Paju-si (KR); KyungMin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 67 days.

(21) Appl. No.: 17/133,901

(22) Filed: Dec. 24, 2020

(65) Prior Publication Data
US 2021/0202685 A1 Jul. 1, 2021

(30) Foreign Application Priority Data

Dec. 31, 2019 (KR) .......................... 10-2019-0179638

(51) Int. Cl.
*H01L 27/32* (2006.01)
*H01L 51/00* (2006.01)
(Continued)

(52) U.S. Cl.
CPC ........... *H10K 59/18* (2023.02); *H10K 50/844* (2023.02); *G02F 1/133305* (2013.01);
(Continued)

(58) Field of Classification Search
CPC ............ H01L 27/3293; H01L 27/3276; H01L 27/3244; H01L 27/32; H01L 27/322; H01L 27/3297; H01L 51/5253; H01L 51/0097; H01L 51/502; G02F 1/13452; G02F 1/13458; G02F 1/133512; G02F 1/136209; G02F 1/133305; G06F 1/1652; G09G 3/3266; G09G 3/3275; G09G 2300/0408; G09G 2300/0804; H10K 59/18; H10K 59/38; H10K 59/131; H10K 59/12;
(Continued)

(56) References Cited

U.S. PATENT DOCUMENTS

2005/0140290 A1* 6/2005 Park ................... H01L 27/3253
313/506
2007/0170324 A1* 7/2007 Lee ..................... H01L 51/5237
248/247

(Continued)

FOREIGN PATENT DOCUMENTS

KR 10-2019-0079283 A 7/2019

*Primary Examiner* — Ida M Soward
(74) *Attorney, Agent, or Firm* — Morgan, Lewis & Bockius LLP

(57) ABSTRACT

A large-area display apparatus may include: a cover plate; a plurality of unit display panels arrayed on one surface of the cover plate, each of the unit display panels including a substrate; a display area defined at middle portions of the substrate; a non-display area around the display area; a pad portion disposed in the non-display area; a first terminal disposed outside the pad portion in the non-display area; and a second terminal apart from the first terminal disposed outside the pad portion in the non-display area; and a connecting member disposed between two unit display panels, the connecting member connecting the first terminals of the unit display panels and the second terminals of the unit display panels, respectively.

15 Claims, 13 Drawing Sheets

(51) Int. Cl.
| | |
|---|---|
| *H01L 51/50* | (2006.01) |
| *H01L 51/52* | (2006.01) |
| *G02F 1/13* | (2006.01) |
| *G06F 1/16* | (2006.01) |
| *G09F 9/30* | (2006.01) |
| *H10K 59/18* | (2023.01) |
| *H10K 50/844* | (2023.01) |
| *G02F 1/1333* | (2006.01) |
| *G09G 3/3266* | (2016.01) |
| *G09G 3/3275* | (2016.01) |
| *G02F 1/1362* | (2006.01) |
| *G02F 1/1335* | (2006.01) |
| *H10K 50/115* | (2023.01) |
| *H10K 59/38* | (2023.01) |
| *H10K 77/10* | (2023.01) |

(52) U.S. Cl.
CPC .. *G02F 1/133512* (2013.01); *G02F 1/136209* (2013.01); *G06F 1/1652* (2013.01); *G09G 3/3266* (2013.01); *G09G 3/3275* (2013.01); *G09G 2300/0408* (2013.01); *G09G 2300/0804* (2013.01); *H10K 50/115* (2023.02); *H10K 59/38* (2023.02); *H10K 77/111* (2023.02)

(58) Field of Classification Search
CPC .... H10K 59/00; H10K 50/844; H10K 50/115; H10K 77/111
See application file for complete search history.

(56) References Cited

U.S. PATENT DOCUMENTS

| | | | |
|---|---|---|---|
| 2008/0036387 A1* | 2/2008 | Jung | H01L 27/3276 445/24 |
| 2014/0071107 A1* | 3/2014 | Hong | G09G 3/3225 345/76 |
| 2014/0111498 A1* | 4/2014 | Kim | G09G 3/3291 345/82 |
| 2014/0176399 A1* | 6/2014 | Lee | G09G 3/20 345/55 |
| 2014/0185169 A1* | 7/2014 | Jung | G09G 3/3685 361/56 |
| 2014/0354620 A1* | 12/2014 | Kim | G09G 3/3696 345/212 |
| 2016/0118454 A1* | 4/2016 | Park | H01L 27/3279 257/40 |
| 2016/0371558 A1* | 12/2016 | Lee | G02F 1/133514 |
| 2017/0194593 A1* | 7/2017 | Ma | H10K 59/131 |
| 2017/0372653 A1* | 12/2017 | Park | H01L 27/0292 |
| 2019/0206949 A1* | 7/2019 | Park | H10K 59/122 |
| 2019/0348491 A1* | 11/2019 | Chung | H10K 59/131 |
| 2020/0174526 A1* | 6/2020 | Jeong | G06F 1/1626 |
| 2020/0176657 A1* | 6/2020 | Jang | H01L 33/62 |
| 2020/0185428 A1* | 6/2020 | Um | H01L 51/0097 |
| 2020/0185641 A1* | 6/2020 | Jeong | H01L 51/0097 |
| 2020/0192524 A1* | 6/2020 | Lee | G09G 3/006 |
| 2020/0212356 A1* | 7/2020 | Kim | H01L 51/5253 |
| 2020/0214127 A1* | 7/2020 | Choi | H05K 1/111 |
| 2021/0210585 A1* | 7/2021 | Lee | G09G 3/3233 |
| 2021/0305351 A1* | 9/2021 | Cho | H01L 27/3276 |

* cited by examiner

DISPLAY PANEL AND LARGE DISPLAY APPARATUS HAVING THE SAME

CROSS-REFERENCE TO RELATED APPLICATIONS

This application claims the priority benefit of the Korean Patent Application No. 10-2019-0179638 filed in the Republic of Korea on Dec. 31, 2020, the entire contents of which is hereby expressly incorporated by reference as if fully set forth herein into the present application.

BACKGROUND

Technical Field

The present disclosure relates to a display panel and a large display apparatus including the same display panel and a connecting member (or tiling coupler), and more particularly, to a large display apparatus maintaining a high level voltage and a low level voltage in a constant value over the entire area of the display apparatus including a connecting member with which a plurality of display panels are combined in a matrix manner on the same plane to be expandable without limitation in shape and size.

Discussion of the Related Art

As the information society develops, the demands for display apparatus are also developing in various manners. For example, various flat panel display apparatus such as a liquid crystal display (or LCD), and organic light emitting display (or OLED), and a mirco LED display have been developed.

The flat panel display apparatus are being developed in various sizes and usages, from small sized electronic devices such as the mobile phones to large sized electronic devices such as outdoor advertising panels. In particular, the demand for a large display apparatus is increasing. For example, it is installed in a stadium and displays information related to the game, and is used for various purposes such as a large billboard displaying and playing a main game scene.

Such a large display apparatus may be manufactured in a size comparable to that of a building's outer wall. However, it is very hard to manufacture an ultra-large flat panel display apparatus using conventional technologies. In order to solve this problem, a plurality of display panels may be arranged and assembled in a tiling manner to implement a large display apparatus, rather than manufacturing a large display apparatus with a single panel.

Such a display apparatus is called as a tiled display apparatus. Since the tiled large display apparatus may be manufactured by assembling a plurality of display panels, a seam region which is a connecting portions of the display panels, is recognized when the gaps between the display panels are larger than a certain gap. In addition, as a plurality of display panels may be disposed and combined on the same plane, it may be required that the spacing between panels on the XY plane is minimized, and there is no height difference on the Z axis. In a large display apparatus capable of freely changing a size by combining a plurality of display panels in a matrix manner, the display panels to be combined are arranged on a plane with the same height, and they may be combined on the same plane without error in the spacing. Consequently, there is a need for new coupling structure to enable this condition easily.

SUMMARY

Accordingly, embodiments of the present disclosure are directed to a display panel and a large display apparatus having the same that substantially obviate one or more of the problems due to limitations and disadvantages of the related art.

The purpose of the present disclosure, as for solving the problems described above, is to provide a display apparatus formed in a large area by assembling a plurality of unit display devices (or unit display panels) in a tiling manner. Another purpose of the present disclosure is to provide a large area display apparatus in which a uniform low level voltage and high level voltage are maintained over the entire area of the large display apparatus by connecting each power terminal provided in a plurality of unit display panels. Still another purpose of the present disclosure is to provide an excellent display quality without luminance or brightness deviation in a large area display apparatus formed by tiling a plurality of unit display panels.

Another purpose of the present disclosure is to provide a large area display apparatus including a connecting member which may uniformly aligned the height of the display panels and assemble a plurality of display panels with a uniform seam portion. Yet another purpose of the present disclosure is to provide a display apparatus including a connecting member with which any one defected display panel may be easily disassembled after a plurality of display panels are assembled in a tiling method, and then it may be easily replaced by a new display panel in the removed panel position.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a unit display panel comprises: a substrate; a display area defined at a middle portion of the substrate and a non-display area around the display area; a pad portion disposed at the non-display area; and a plurality of power terminals disposed outside of the pad portion in the non-display area.

In one example, the power terminals includes: a first terminal connected to a low level pad in the pad portion; and a second terminal connected to a high level pad in the pad portion.

In one example, the first terminal is divided into a plurality of first terminals which are arrayed with a predetermined distance on at least one side of the substrate. Each of the second terminal is divided into a plurality of second terminals which are arrayed between two neighboring first terminals.

In one example, at least one pair of the first terminal and the second terminal are disposed on each of 4 sides of the substrate.

In one example, the first terminal is disposed along a perimeter of the substrate. The second terminal is parallel with the first terminal.

In one example, the first terminal has a closed line along the perimeter of the substrate, and the second terminal has another closed line along the perimeter of the substrate.

In one example, the unit display panel further comprises: an emission layer disposed in the display area on the substrate; an encapsulation layer covering the emission layer; a circuit board including a timing controller and disposed on the encapsulation layer; and a flexible film including a source driving integrated circuit, of which one side is connected to the circuit board and other side is connected to the pad portion.

In addition, a large-area display apparatus according to the present disclosure comprises: a cover plate; a plurality of unit display panels arrayed on one surface of the cover plate, each of the unit display panel includes: a substrate; a display area defined at middle portions of the substrate; a non-display area around the display area; a pad portion disposed in the non-display area; a first terminal disposed outside the pad portion in the non-display area; and a second terminal apart from the first terminal disposed outside the pad portion in the non-display area; and a connecting member disposed between two unit display panels, the connecting member connecting the first terminals of the unit display panels and the second terminals of the unit display panels, respectively.

In one example, the plurality of unit display panels are arrayed in a matrix manner including n rows and m columns (here, n and m are natural numbers larger than 1). The connecting member includes: a first member disposed between two unit display panels neighboring in the column direction; and a second member disposed between two unit display panels neighboring in the row direction.

In one example, the first member includes: a first link line connecting the first terminals of the neighboring two unit display panels; and a second link line connecting the second terminals of the neighboring two unit display panels, and electrically separated from the first terminals.

In one example, the second member includes: a first link line connecting the first terminals of the neighboring two unit display panels; and a second link line connecting the second terminals of the neighboring two unit display panels, and electrically separated from the first terminals.

In one example, the first member and the second member are assembled with 'X' shape at a corner where the 4 unit display panels are joined.

In one example, the first member and the second member have a rod shape disposed between the neighboring two unit display panel. The connecting member further includes: a center member fastening with the first member and the second member as having '+' shape and disposing at the corner where the 4 unit display panels are joined.

In one example, the first terminal is divided into a plurality of the first terminals which are arrayed with a predetermined distance on at least one side of the substrate. The second terminal is divided into a plurality of the second terminals which are arrayed between two neighboring first terminals. The connecting member includes: a base having a width and a length; a first link line extended from one end to other end crossing the width as corresponding to the first terminal; a second link line extended from the one end to the other end crossing the width as corresponding to the second terminal; and a passivation layer covering the middle of the first link line and the second link line and exposing both ends of the first link line and the second link line.

In one example, the first terminal is disposed along the perimeter of the substrate. The second terminal is disposed as parallel with the first terminal. The connecting member includes: a base having a width and a length; a first link line extended from one end to other end crossing the width as corresponding to the first terminal on the base; an insulating layer covering the first link line and exposing both ends of the first link line; a second link line extended from the one end to the other end crossing the width as corresponding to the second terminal on the insulating layer; and a passivation layer covering the second link line and exposing both ends of the first link line and the second link line.

In one example, the large area display apparatus further comprises: a first extending line crossing the length for connecting to the both ends of the first link line, and corresponding to the first terminal under the insulating layer; and a second extending line crossing the length for connecting the both ends of the second link line, and corresponding to the second terminal under the insulating layer.

The large area display apparatus according to the present disclosure includes an assembling mechanism in which after a plurality of display panels having the power terminals on the outmost sides are arrayed in a matrix manner, the connecting member may be used for connecting the power terminals of neighboring display panels. Therefore, in a large area display apparatus formed by tiling a plurality of unit display panels, all power terminals of all unit display panels are connected with each other. As a result, there is no voltage drop down or voltage fluctuation in high level voltage and low level voltage over the entire display area of the large area display apparatus. Accordingly, the present disclosure may provide a large area display apparatus with excellent image quality with uniform luminance across the entire display screen.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
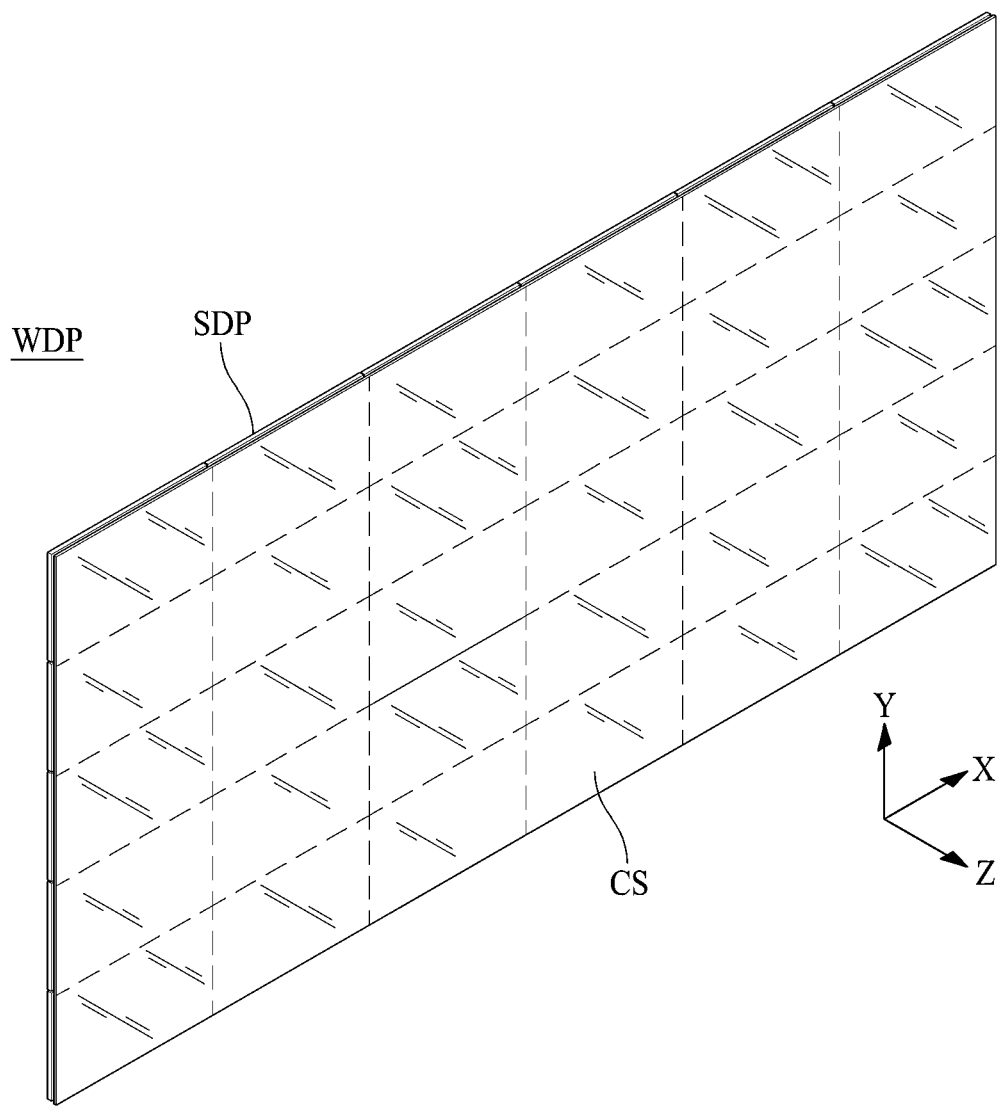
FIG. 1 is a perspective view for illustrating the overall appearance of a large area display apparatus assembled in a tiling manner according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed as a second element, and, similarly, a second element could be termed a first element, without departing from the scope of the present disclosure.

"X axis direction", "Y axis direction" and "Z axis direction" may not be interpreted only as a geometric relationship in which the relationship between each other is perpendicular, and may mean that the configuration of the present disclosure has a wider scope to the extent that it may functionally work.

In describing the elements of the present disclosure, terms such as the first, the second, A, B, (a) and (b) may be used. These terms are used only to distinguish the elements from other elements, and the terms are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

The 'display apparatus' in this application may comprise a liquid crystal module (LCM), an organic light emitting display module (OLED Module), or a quantum dot module (QD Module) which has a display panel and a driver for driving the display panel. The 'display apparatus' may further comprise a complete product or final product including LCM, OLED Module or QD Module such as a notebook computer, a television set, a computer monitor, an equipment apparatus having an automotive apparatus or other modules for vehicle, a set electronic apparatus or a set device (or set apparatus) such as a smart phone or a mobile electronic apparatus.

Therefore, the 'display apparatus' may be any one of display devices such as LCM, OLED Module and QD Module, an application device including LCM, OLED Module or QD Module, or a set apparatus for end user's final devices.

In another example, the LCM, OLED Module or QD Module may be referred to the 'display apparatus', and the final electronic devices including LCM, OLED Module or QD Module may be referred to the 'set apparatus'. For example, the display apparatus may include a display panel of liquid crystal display or organic electroluminescence display, and a source printed circuit board (PCB) for driving the display panel. The set apparatus may include the display apparatus and a set PCB or control PCB for driving the set apparatus itself by connecting to the display apparatus and the source PCB.

The display panel according to the embodiments of the present disclosure may include a liquid crystal display panel, an organic light emitting diode display panel, and an electroluminescent display panel, but it is not limited thereto. For example, a display panel may have any structure in which the display panel may be vibrated to generate sound. In addition, the display panel applied to the display apparatus according to the embodiment of the present disclosure is not limited to the shape or size of the display panel.

In the case that the display panel is the liquid crystal display panel, the display panel may include a plurality of gate lines, a plurality of data lines, and a plurality of pixels (or sub pixels) defined by the gate lines and the data lines. The display panel may include an array substrate including thin film transistor as a switching element for controlling the light transmittance of each pixel, an upper substrate including a color filter and/or a black matrix, and a liquid crystal layer disposed between the array substrate and the upper substrate.

In the case that the display panel is an organic light emitting diode display panel, the display panel may include a plurality of gate lines, a plurality of data lines, and a plurality of pixels (or sub pixels) defined by the gate lines and the data lines. The display panel may include an array substrate including thin film transistor for applying the electric voltage to each pixel selectively, an organic light emitting layer on the array substrate, and an encapsulation substrate disposed on the array substrate for covering the organic light emitting layer. The encapsulation substrate may protect the thin film transistor and the organic light emitting layer from any external shocks, and prevent moisture and oxygen from penetrating into the organic light emitting layer. In addition, the organic light emitting layer formed on the array substrate may be replaced by the inorganic light emitting layer, the quantum dot light emitting layer, or the micro light emitting diode element.

Hereinafter, an example of a display apparatus according to the present disclosure will be described in detail with reference to the accompanying drawings. In designating reference numerals to elements of each drawing, the same components may have the same reference numerals wherever possible even though they are shown in different drawings. Scale of the elements shown in the accompanying drawings have a different scale from the actual for convenience of description, it is not limited to the scale shown in the drawings.

Referring to FIG. 1, a display apparatus assembled in a tiling manner according to the present disclosure will be explained. FIG. 1 is a perspective view for illustrating the overall appearance of a large area display apparatus assembled in a tiling manner according to the present disclosure.

The coordinate system shown in FIG. 1 is added for convenience of explanation. For example, a large area display apparatus WDP may be formed by assembling a plurality of unit display panels SDP in a tiling method on a cover plate CS disposed on a wall of XY plane. The large area display apparatus WDP may provide the video information to the Z direction. The viewer may view the video image provided by the large area display apparatus by looking at the XY plane in the Z direction.

As shown in FIG. 1, a plurality of unit display panels SDP may be disposed in a matrix manner on a wall structure. FIG. 1 illustrates a structure in which 30 unit display panels are tiled with six display panels in the lateral (or row) direction and five display panels in the portrait (or column) direction. It is not limited thereto, and it is possible to form a large area display apparatus WDP of a desired size with more or less numbers of the unit display panels SDP. The cover plate CS may be disposed on the top surface of the unit display panels SDP, and may be a reference panel on which the plurality of unit display panels SDP are assembled on a same plane in a tiling method. Further, the cover plate CS may have a protective function or optical function enhancing the properties of the unit display panel SDP.

Even though not shown in figures, a plurality of frames, i.e., back frames, may be applied for arranging the unit display panels SDP in a tiling manner. For example, the back frames may be fixed or installed on a wall structure by a fixing member in a matrix manner. The fixing member may have a coupling structure for fixing the frame to the wall structure, such as anchors, screws, concrete nails or the like. On each of the back frame fixed on the wall structure, each of the unit display panels SDP may be installed.

Hereinafter, various embodiments of a structure for assembling the unit display panels SDP will be explained. In particular, referring to figures, various embodiments according to the present disclosure will be provided for explaining the connecting mechanisms in which the difference between the high level voltage and the low level voltage applied to the unit display panels SDP is maintained in a constant value, by connecting the power terminals which are the most important element for maintaining the display quality.

First Embodiment

Figure 2:
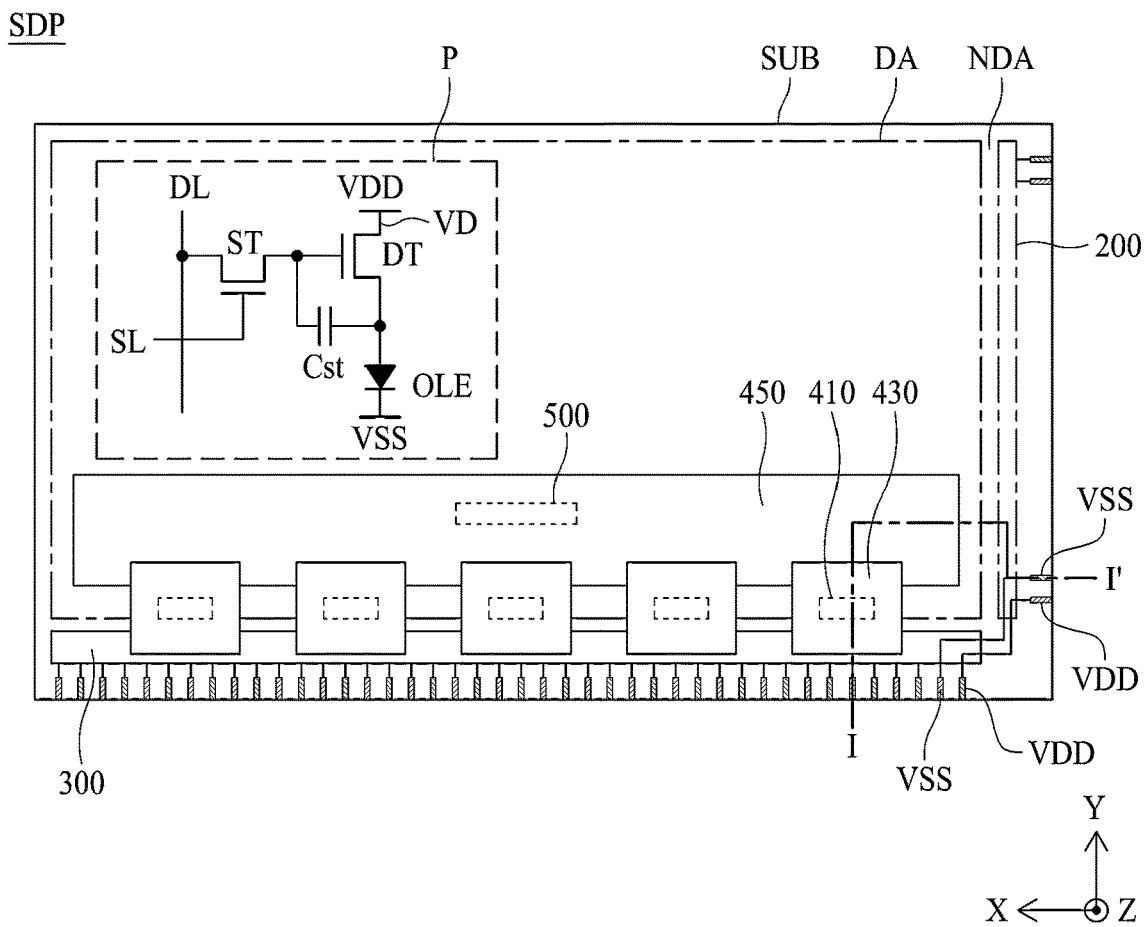
FIG. 2 is a plan view for illustrating a structure of a unit display panel according to the present disclosure.
Figure 3:
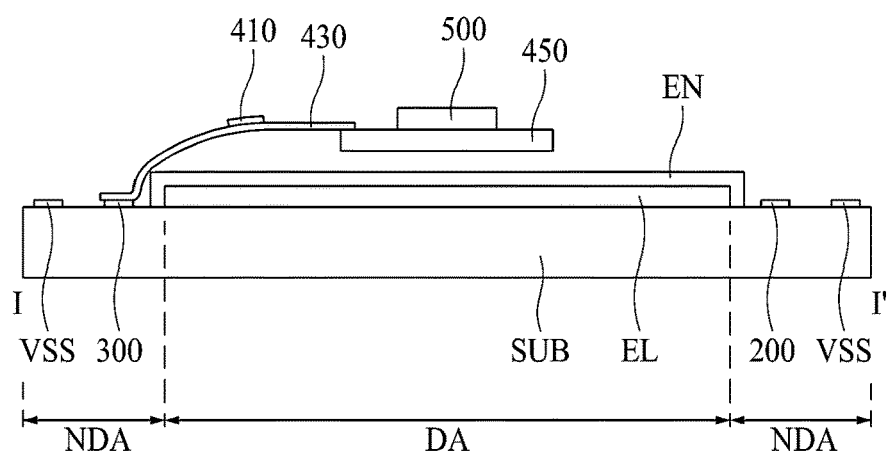
FIG. 3 is a cross-sectional view along the cutting line I-I' in FIG. 2.

Hereinafter referring to FIGS. 2 to 7, a first embodiment of the present disclosure will be explained. Firstly, referring to FIGS. 2 and 3, a structure of a unit display panel according to the first embodiment of the present disclosure will be explained. FIG. 2 is a plan view for illustrating a structure of a unit display panel according to the present disclosure. FIG. 3 is a cross-sectional view along the cutting line I-I' in FIG. 2.

Referring to FIG. 2, a unit display panel SDP according to the present disclosure may comprise a substrate SUB, a gate driver (or scan driver) 200, a data pad portion 300, a source driving integrated circuit 410, a flexible film 430, a circuit board 450 and a timing controller 500.

The substrate SUB may include an isolation material or a flexible material. The substrate SUB may be made of glass, metal or plastic, but embodiments are not limited thereto. When the unit display panel includes a flexible display panel, the substrate SUB may be made of a flexible material such as the plastic materials. For example, the substrate SUB may include a polyimide material.

The substrate SUB may include a display area DA and a non-display area NDA. The display area DA is the area for representing video images, and may be defined at most of the middle portions of the substrate SUB, but the embodiments are not limited thereto. The display area DA may include a plurality of scan lines (SL) (or gate lines), a plurality of data lines DL, a plurality of driving current lines VD and a plurality of pixels P. The pixel P may be defined as an area surrounded by the scan line SL, the data line DL and the driving current line VD. The pixel P may include a plurality of sub pixels, and each of the sub pixels may be surrounded by the scan line SL and the data line DL.

The non-display area NDA may be an area not providing video image, and may be defined at perimeter area of the substrate SUB as surrounding all or a part of the display area DA. In the non-display area NDA, the gate driver 200 and the data pad portion 300 are disposed.

The gate driver 200 may supply the scan signal (or gate signal) to the scan lines SL according to the gate signal received from the timing controller 500. The gate driver 200 may be formed as a GIP (Gate driver In Panel) type at the non-display area NDA outside of the display area DA in the substrate SUB. The GIP type refers to the structure in which the gate driver 200 may be directly formed on the substrate SUB.

The data pad portion 300 may supply the data signals to the data lines DL according to the data control signal received from the timing controller 500. The data pad portion 300 may be made in a driving chip type and mounted on the flexible film 430. The flexible film 430 may be attached by a TAP (Tape Automated Bonding) method at the non-display area NDA surrounding the display area DA in the substrate SUB.

The source driving integrated circuit 410 may receive the digital video data and the source control signal from the timing controller 500. The source driving integrated circuit 410 may convert the digital video data into the analog data voltages according to the source control signal and then supply them to the data lines DL. When the source driving integrated circuit 410 is made in one chip type, it may be mounded on the flexible film 430 by COF (Chip On Film) or COP (Chip On Plastic) method.

The flexible film 430 may include a plurality of bus lines connecting the data pad portion 300 and the source driving integrated circuit 410, and connecting the data pad portion 300 and the circuit board 450. The flexible film 430 may be attached with the data pad portion 300 using an anisotropic conducting film, so the data pad portion 300 may be connected to the bus lines on the flexible film 430.

The circuit board 450 may be attached to the flexible films 430. The circuit board 450 may have a plurality of circuits formed as a driving chip type. For example, the timing controller 500 may be mounted on the circuit board 450. The circuit board 450 may be a printed circuit board or a flexible printed circuit board.

The timing controller 500 may receive the digital video data and the timing signal from the external system board through a cable (not shown) attached to the circuit board 450. The timing controller 500 may generate the gate control signal for controlling the operation timing of the gate driver 200 based on the timing signal and the source control signal for controlling the source driving integrated circuits 410 based on the timing signal. The timing controller 500 may supply the gate control signal to the gate driver 200 and the source control signal to the source driving integrated circuits 410. For another example, the timing controller 500 may be formed in one chip type with the source driving integrated circuit 410 and then mounted on the substrate SUB.

The unit display panel SDP according to the first embodiment of the present disclosure may further include a power connecting terminal TD disposed at the outer side of the non-display area NDA. For example of an organic light emitting diode display panel, the connecting terminal TD may include a low level terminal VSS receiving the low level voltage and a high level terminal VDD receiving the high level voltage. The light emitting diode may be driven by the electric voltage corresponding to the data signal having any voltage value selected between the low level voltage and the high level voltage. Therefore, it is very important that the low level voltage and the high level voltage may be supplied in a constant value, respectively, to the organic light emitting diode display panel.

The low level terminal VSS and the high level terminal VDD may be connected to the data pad portion 300. The data pad portion 300 may include a plurality of pads for receiving the low level voltage and the high level voltage. For example, the low level terminal VSS may be disposed at the outer side of the substrate SUB as extending from the low level pad disposed at the data pad portion 300. In addition, the high level terminal VDD may be disposed at the outer side of the substrate SUB as extending from the high level pad disposed at the data pad portion 300.

When it is necessary, the low level terminal VSS and the high level terminal VDD may further disposed near the gate driver 200 at the outer side of the substrate SUB. For example, when the unit display panel SDP has a rectangular shape, the data pad portion 300 may be disposed at the lower side, and the gate driver 200 may be disposed at the right side. In this case, a plurality of low level terminals VSS and a plurality of high level terminals VDD may be arrayed with a predetermined interval at the lower side of the substrate SUB. In addition, a pair of the low level terminal VSS and the high level terminal VDD may be disposed at the upper corner of the right side, and another pair of them may be disposed at the lower corner of the right side.

Referring to FIG. 3, the cross-sectional structure of the unit display panel SDP according to the first embodiment of the present disclosure is shown. FIG. 3 is a cross-sectional view along the cutting line I-I' in FIG. 2.

An emission layer EL may be formed in the display area DA on the substrate SUB. An encapsulation layer EN may be disposed on the emission layer EL. For an example of an organic light emitting diode display panel, the emission layer EL may include a thin film transistor and an organic light emitting diode. The thin film transistor may be connected to the organic light emitting diode to drive it. As driven by the thin film transistor, the organic light emitting diode may represent lights corresponding to the video image.

The unit display panel according to the present disclosure has a structure with which a large area display apparatus is implemented by tiling the unit display panels in a matrix manner, so that the detailed structure of the each unit display panel may not be explained.

The encapsulation layer EN, as the element for protecting the emission layer EL, may prevent any foreign material or gases from intruding into the emission layer EL from the external environment. The encapsulation layer EN may have a structure in which the inorganic layers and the organic layers are alternately stacked.

Over the encapsulation layer EN, the circuit board 450 may be located. The circuit board 450 may include the timing controller 500. One side of the circuit board 450 may be connected to the data pad portion 300 through the flexible film 430. On the flexible film 430, the source driving integrated circuit 410 may be mounted. One side of the source driving integrated circuit 410 may be connected to the timing controller 500 through the flexible film 430, and the other side of the source driving integrated circuit 410 may be connected to the data pad portion 300 through the flexible film 430.

In the non-display area NDA of the substrate SUB for unit display panel SDP, the low level terminal VSS and the high level terminal VDD are disposed at the outermost side. Connecting the low level terminal VSS and the high level terminal VDD of one unit display panel SDP with the low level terminal VSS and the high level terminal VDD of another neighboring unit display panel SDP, The low level voltage and the high level voltage may be kept in constant voltages, respectively, without any fluctuation. Here, the low level terminal VSS and the high level terminal VDD may be the elements for supplying the basic voltages for driving the emission layer EL, and may be referred to the 'power terminal'.

Figure 4:
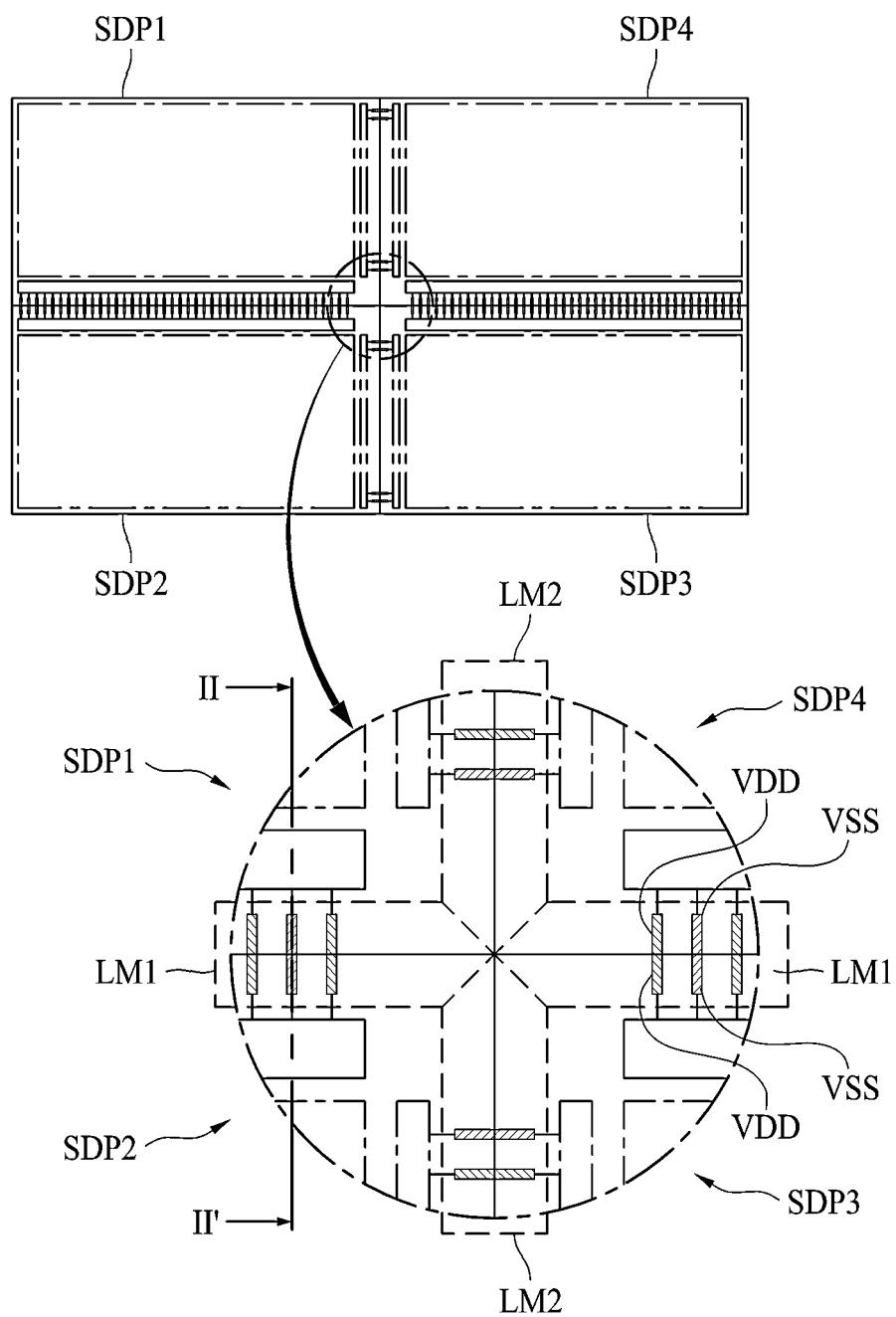
FIG. 4 is a plane view for illustrating a structure of a large area display apparatus in which a plurality of unit display panels are assembled in a tiling manner according to the first embodiment of the present disclosure.
Figure 5:
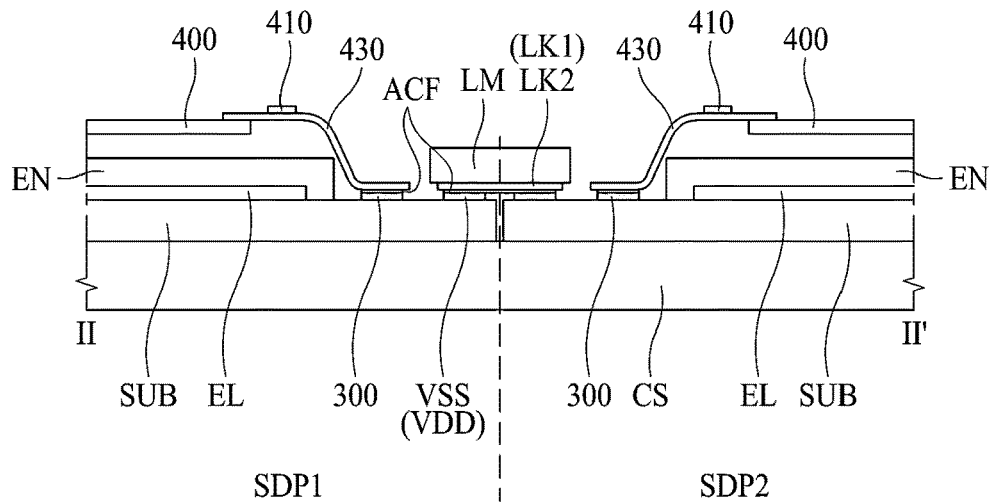
FIG. 5 is a cross-sectional view along the cutting line II-IF in FIG. 4.

Referring to FIGS. 4 and 5, a structure of the large area display apparatus formed by tiling the unit display panels according to the first embodiment of the present disclosure will be explained. FIG. 4 is a plane view for illustrating a structure of a large area display apparatus in which a plurality of unit display panels are assembled in a tiling manner according to the first embodiment of the present disclosure. FIG. 5 is a cross-sectional view along the cutting line II-II' in FIG. 4.

A large area display apparatus according to the first embodiment of the present disclosure may have a structure in which a plurality of unit display panels is arrayed in a matrix manner consisting of n rows and m columns. FIG. 4 shows a case in which 4 unit display panels are arranged in 2×2 matrix manner to form a large area display apparatus. For example, by assembling or arranging 4 unit display panels of which each panel has a diagonal length of 80 inch, a large area display apparatus having a diagonal length of 160 inch may be configured.

Referring to FIG. 4, a large area display apparatus WDP according to the first embodiment may comprises a first unit display panel SDP1, a second unit display panel SDP2, a third unit display panel SDP3 and a fourth unit display panel SDP4. Between each two of the unit display panels SDP1, SDP2, SDP3 and SDP4, a connecting member LM may be disposed. The connecting member LM may include a horizontal member LM1 and a vertical member LM2.

For an example, between the first unit display panel SDP1 and the second unit display panel SDP2, the horizontal member LM1 may be disposed. Between the second unit display panel SDP2 and the third unit display panel SDP3, the vertical member LM2 may be disposed. Between the third unit display panel SDP3 and the fourth unit display panel SPD4, the horizontal member LM1 may be disposed. Between the fourth unit display panel SDP4 and the first unit display panel SDP1, the vertical member LM2 may be disposed.

The horizontal members LM1 and the vertical members LM2 may be joined to each other in the 'X' shape at the point where the four unit display panels SDP1, SDP2, SDP3 and SDP4 are met. To do so, the end portion of the horizontal member LM1 and the vertical member ML2 may have bracket shape like '<' or '>'.

Referring to FIG. 5, the cross-sectional structure of the joining portions between the first unit display panel SDP1 and the second unit display panel SDP2 will be explained. The large area display apparatus WDP according to the first embodiment of the present disclosure may be formed as tiling four unit display panels SDP1, SDP2, SDP3 and SDP4 on the cover plate CS, by arranging on a same leveled plane. For example, on the cover plate CS, the first unit display panel SDP1 and the second unit display panel SDP2 are arranged as the data pade portions 300 of them are neighbored to each other.

In this case, each of the first unit display panel SDP1 and the second unit display panel SDP2 may have an emission layer EL formed in the display area DA and an encapsulation layer EN covering the emission layer EL, respectively. Further, a data pad portion 300 may be disposed outside the encapsulation layer EN, respectively. The data pad portion 300 may be connected to one sides of the flexible films 430 using the anisotropy conductive film ACF, respectively. Each of the other sides of the flexible films 430 may be connected to the circuit board 400. On the flexible film 430, the source driving integrated circuit 410 may be mounted. Here, as the first unit display panel SDP1 and the second unit display panel SDP2 have the same structure, the same reference numeral is used for the same elements in figures.

Outside each data pad 300 of the first unit display panel SDP1 and the second unit display panel SDP2, the high level terminal VDD is disposed. The first unit display panel SDP1 and the second unit display panel SDP2 are arranged as their sides are contacted with each other on the same leveled plane. Therefore, the high level terminals VDD are disposed as neighboring on the same leveled plane.

The connecting member LM may be disposed on the joining portion of the first unit display panel SDP1 and the second unit display panel SDP2. Here, the connecting member LM may be a member for connecting the low level terminal VSS of the first unit display panel SDP1 and the low level terminal VSS of the second unit display panel SDP2. Therefore, the connecting member LM may include a second link line LK2 for electrically connecting the low level terminal VSS of the first unit display panel SDP1 and the low level terminal VSS of the second unit display panel SDP2. In FIG. 5, as showing the cross-sectional view cutting the low level terminal VSS, the high level terminal VDD is not shown. However, the connecting member LM may further include a first link line LK1 for electrically connecting the high level terminal VDD of the first unit display panel SDP1 and the high level terminal VDD of the second unit display panel SDP2.

Figure 6:
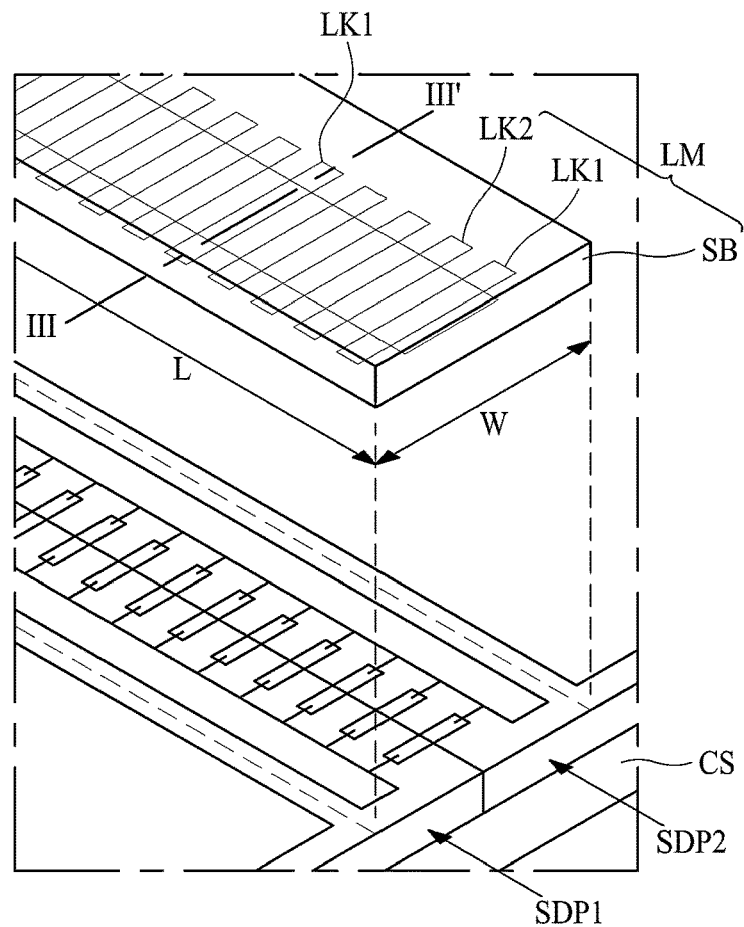
FIG. 6 is an enlarged perspective view for illustrating a structure of the joining portion in the large area display apparatus according to the first embodiment of the present disclosure.
Figure 7:
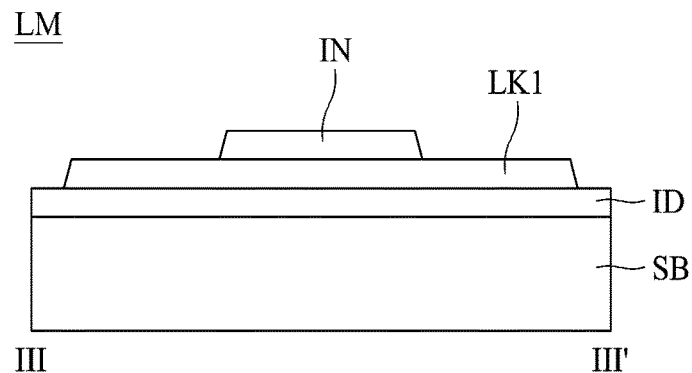
FIG. 7 is a cross-sectional view along the cutting line in FIG. 6.

Hereinafter, referring to FIGS. 6 and 7, the connecting structure of tiled portion in the large area display apparatus according to the first embodiment of the present disclosure will be explained. FIG. 6 is an enlarged perspective view for illustrating a structure of the joining portion in the large area display apparatus according to the first embodiment of the present disclosure. FIG. 7 is a cross-sectional view along the cutting line in FIG. 6.

Referring to FIGS. 6 and 7, the connecting member LM may include a base SB, a lower insulating layer ID, a first link line LK1, a second link line LK2 and a passivation layer IN. The base SB may be an element for connecting the unit display panels SDP1, SDP2, SDP3 and SDP4 physically and electrically, so it is preferable that the base SB may be made of rigid material. The base SB may be a thin and long plate having a width W and a length L. Here, the width W of the base SB may have a size for covering all of the neighboring power terminals VDD and VSS between the unit display panels SDP1, SDP2, SDP3 and SDP4. The length L of the base SB may be corresponding to one side length of the unit display panel as covering the power terminals VDD and VSS.

In detail, the horizontal member LM1 may have a length corresponding to the landscape side of the unit display panel SDP. The vertical member LM2 may have a length corresponding to the portrait side of the unit display panel. FIGS. 6 and 7 show the representative type of the horizontal member LM1. As the vertical member LM2 has the same structure as the horizontal member LM1, the reference numeral for the horizontal and vertical members is indicated as 'LM', representatively.

The lower insulating layer ID may cover all surface of one side of the base SB. Especially, it is preferable that the lower insulating layer ID may cover all surface of the base SB on which the link lines LK1 and LK2 are formed. For the case that the base SB is made of metal material in order to ensure the strength of the base SB, it is preferable that the lower insulating layer ID may include a highly insulative material for insulating the link lines LK1 and LK2 from each other.

The first link line LK1 may be a line disposed for linking the high level terminals VDD neighboring to each other. For example, the first link line LK1 may have a segment extending in a width W direction, of which one end is corresponding to the high level terminal VDD disposed at the first unit display panel SDP1, and the other end is corresponding to the high level terminal VDD disposed at the second unit display panel SDP2.

In addition, the second link line LK2 may be a line disposed for linking the low level terminals VSS neighboring each other. For example, the second line line LK2 may have a segment extending in a width W direction, of which one end is corresponding to the low level terminal VSS disposed at the first unit display panel SDP1, and the other end is corresponding to the low level terminal VSS disposed at the second unit display panel SDP2. The first link line LK1 and the second link line LK2 may be segments separated from each other as corresponding to the interval gap between the high level terminal VDD and the low level terminal VSS.

The passivation layer IN may cover the middle portions of the first link line LK1 and the second link line LK2, but expose both end portions. The passivation layer IN may be disposed for preventing the middle portions of the first link line LK1 and the second link line LK2 from being shorted by other conductive material or being broken by physical damages. As the first link line LK1 should be connected to the high level terminal VDD and the second link line LK2 should be connected to the low level terminal VSS, both ends of them should be exposed. For other example, a contact hole may be formed at the passivation layer and a pad may be formed therein.

With the above method, the plurality of unit display panels SDP may be assembled in a matrix manner, and the power terminals VDD and VSS are linked respectively by installing the connecting member LM. Therefore, all of the high level terminals VDD may be electrically connected, and all of the low level terminals VSS may be electrically connected, so that they may maintain the same voltage value over the whole area of the assembled unit display panels.

For the organic light emitting diode display apparatus, the brightness of any one pixel may be defined by the selected voltage between the low level voltage and the high level voltage. Therefore, the difference in brightness does not occur between the unit display panels SDP when the low level voltage and the high level voltage applied to the unit display panels SDP are the same. According to the first embodiment of the present disclosure, all low level terminals of all unit display panels are connected, and all high level terminals of all unit display panels are connected, so that the high level voltage and the low level voltage may be maintained in a uniform value over the whole area of the assembled unit display panels. As a result, the present disclosure may provide a large area display apparatus having an excellent display quality without deviations in luminance (or brightness) as tiling the unit display panels.

Second Embodiment

Figure 8:
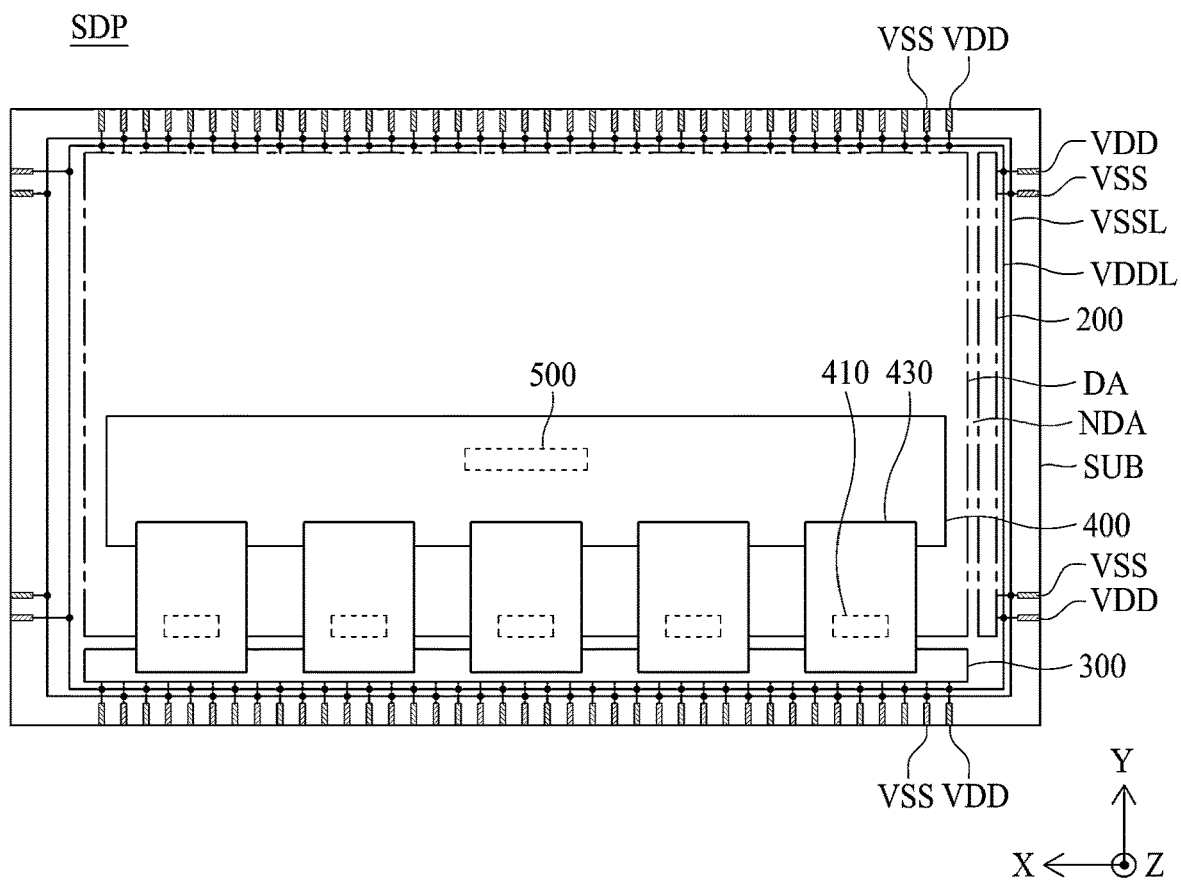
FIG. 8 is a plane view for illustrating a structure of a unit display panel according to the second embodiment of the present disclosure.
Figure 9:
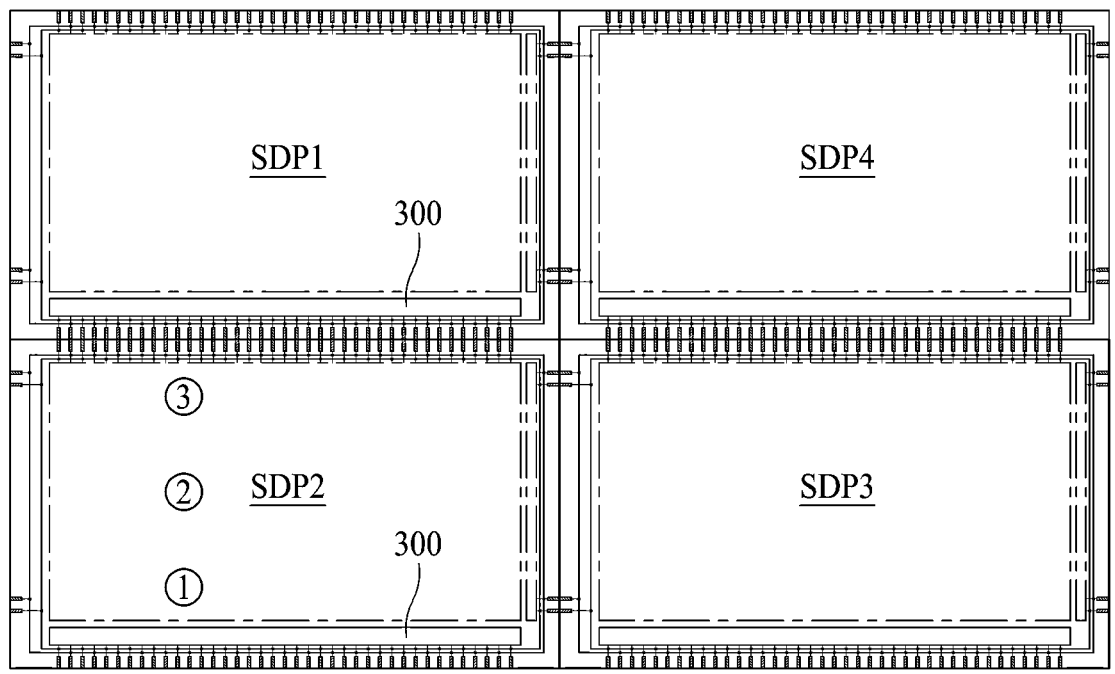
FIG. 9 is a plane view for illustrating structure of a large area display apparatus according to the second embodiment of the present disclosure.
Figure 10A:
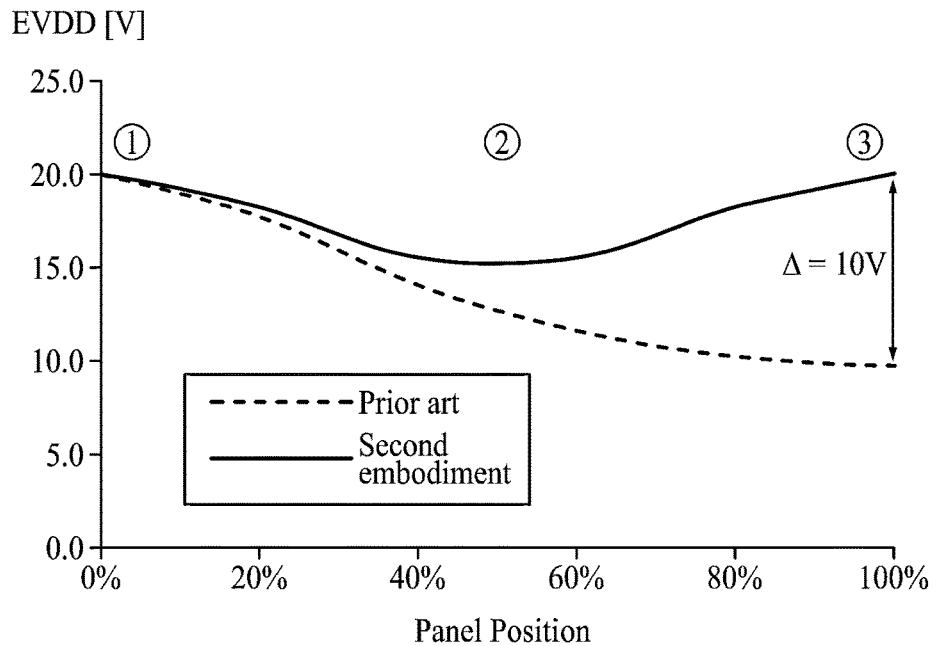
FIGS. 10A and 10B are graphs for showing that the drop-down problem in power voltages is improved by a connecting member in a large display apparatus according the second embodiment of the present disclosure.
Figure 10B:
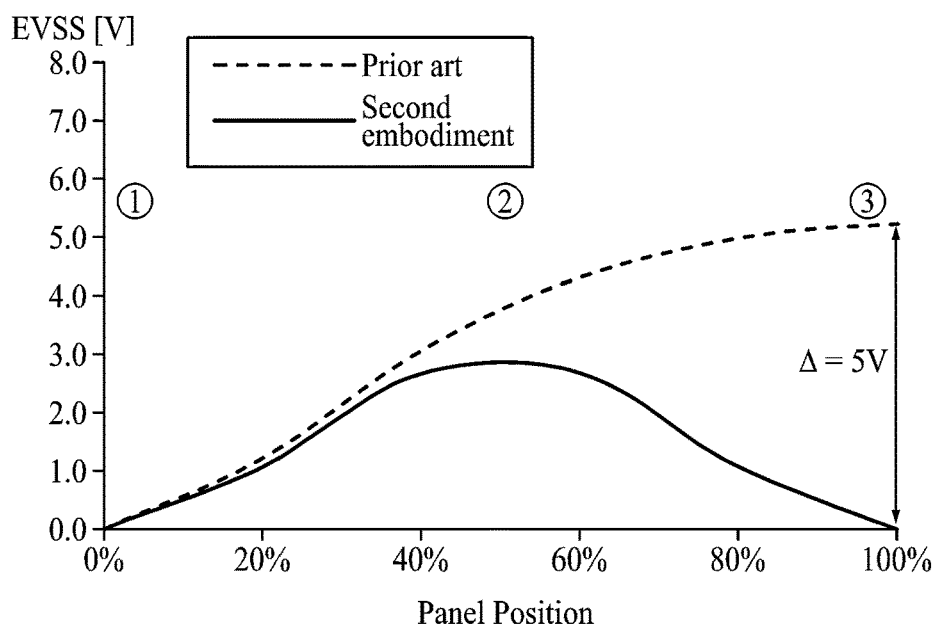

Hereinafter, referring to FIGS. 8 to 10, the coupling (or assembling) structure of the unit display panels to form a large area display apparatus according to the second embodiment of the present disclosure will be explained. FIG. 8 is a plane view for illustrating a structure of a unit display panel according to the second embodiment of the present disclosure. FIG. 9 is a plane view for illustrating structure of a large area display apparatus according to the second embodiment of the present disclosure. FIGS. 10A and 10B are graphs for showing that the drop-down problem in power voltage is improved by a connecting member in a large display apparatus according to the second embodiment of the present disclosure.

At first referring to FIG. 8, the structure of the unit display panel according to the second embodiment will be explained. Comparing with the first embodiment, the unit display panel according to the second embodiment may further comprise a plurality of high level terminals VDD and a plurality of low level terminals VSS disposed on the upper side of the substrate SUB where the data pad portion 300 is not disposed. The high level terminals VDD may be connected to one end of the high level line VDDL crossing the display area DA, wherein the other end of the high level line VDDL is connected to the data pad portion 300. Further, the low level terminals VSS may be connected to one end of the low level line VSSL crossing the display area DA, wherein the other end of the low level line VSSL is also connected to the data pade portions 300.

In addition, on the left side of the substrate SUB where the gate driver 200 is not disposed, a pair of the high level terminal VDD and the low level terminal VSS is disposed at an upper portion and another pair of them is disposed at a lower portion. All of the high level terminals VDD may be connected with each other by the high level line VDDL. The high level line VDDL may be arranged along the edge of the substrate SUB as forming a closed line. Further, all of the low level terminals VSS may be connected with each other by the low level line VSSL. The low level line VSSL may also be arranged along the edge of the substrate SUB as forming another closed line.

Next, referring to FIG. 9, 4 unit display panels shown in FIG. 8 are assembled on a same leveled plane in a tiling method. The main features of the second embodiment different from the first embodiment may be the tiling structure of the first unit display panel SDP1 and the second unit display panel SDP2. For the first embodiment, the sides having the data pad portions 300 are joined to each other. However, for the second embodiment, the opposite side to the side having the data pad portion 300 in the second unit display panel SDP2 may be joined to the side having the data pad portion 300 in the first unit display panel SDP1.

The unit display panel SDP may receive the power voltage from the timing controller 500 via the flexible film 430. From the timing controller 500, the low level voltage and the high level voltage are received. That is, the high level voltage signal and the low level voltage signal are firstly supplied to the data pad portion 300. Then, these power voltage signals may flow over the display area DA, so the voltage drop down may be occurred as these power voltage signals flow to the opposite side to the side having the data pad portion 300.

However, according to the second embodiment, all of the high level terminals VDD disposed in the first unit display panel SDP1 are connected to the high level line VDDL. Further, all of the low level terminals VSS disposed in the first unit display panel SDP1 are also connected to the low level line VSSL.

For example, two high level terminals VDD opposite to each other crossing the unit display panel SDP may have the same voltage value. That is, as the high level voltage signal is transmitted over the display area DA, the high level voltage may not drop down. As shown in graph of FIG. 10A, the voltages at two high level terminals VDD opposite each other have the same leveled voltage.

In addition, two low level terminals VSS opposite to each other crossing the unit display panel SDP may have the same voltage value. That is, as the low level voltage signal is transmitted over the display area DA, the low level voltage may not drop down. As shown in graph of FIG. 10B, the voltages at two low level terminals VSS opposite to each other have the same leveled voltage.

The graph as shown in FIG. 10A illustrates the variation curve of the high level voltage in the unit display panel, and the graph shown in FIG. 10B illustrates the variation curve of the low level voltage in the unit display panel. The solid line is the curve of the power voltage varied in the unit display panel according to the second embodiment, and the dotted line is the curve of the power voltage varied in the unit display panel according to the related art.

Referring to the solid lines, the power voltages on the upper side ③ of the unit display panel may have the same voltage values as that on the lower side ①. At the middle portion ② of the unit display panel SDP, the voltage drop down may be occurred somewhat, because the natural voltage drop down is occurred as the electric power is consumed. However, this voltage fluctuation due to the voltage drop-down occurs naturally in electronic devices, and the overall performance of the electronic devices is designed in consideration of this voltage drop-down. Therefore, it may be treated as a normal fluctuation that doe not affect the image quality.

Accordingly, in the large area display apparatus according to the second embodiment, the power voltages applied to each unit display panel may be maintained in the same leveled voltage value. As a result, all unit display panel may provide the same luminance or brightness, and ensure excellent video image quality. Further, no matter how large a display device is configured, no voltage drop down or voltage fluctuation will occur as the line length increases.

Third Embodiment

Figure 11:
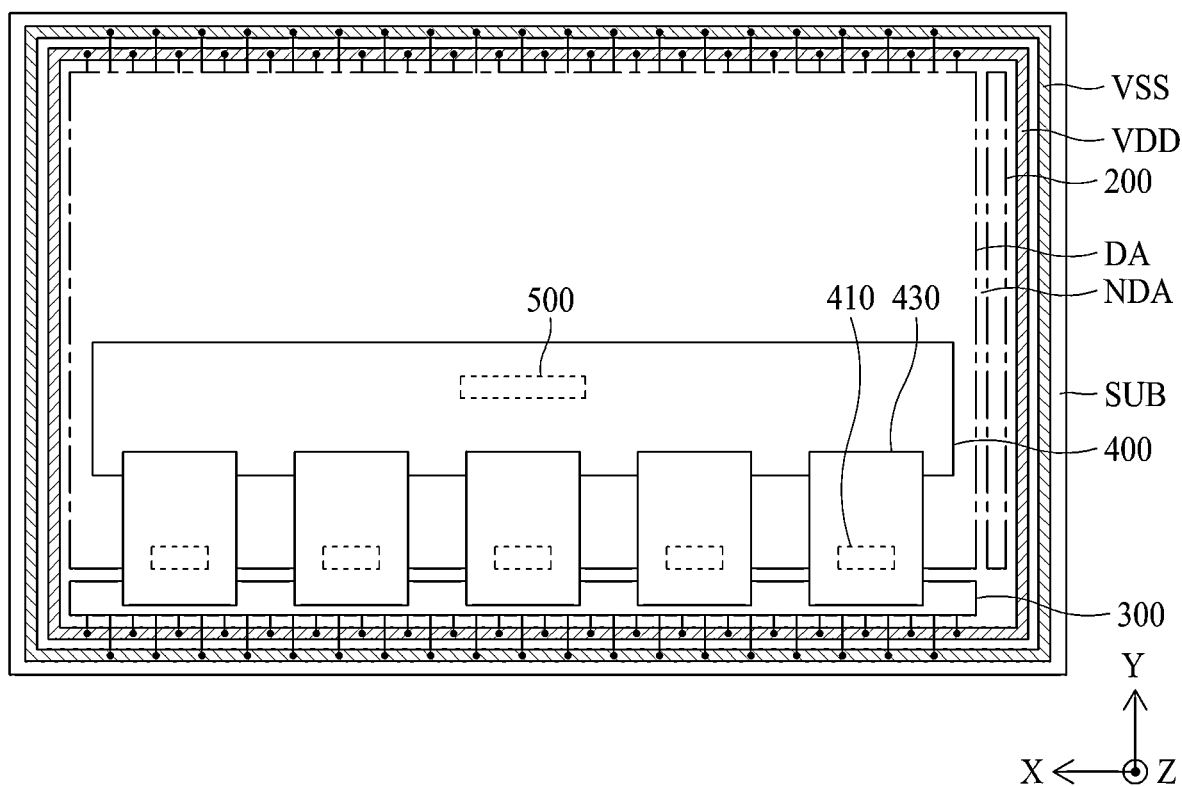
FIG. 11 is a plane view for illustrating a structure of a unit display panel according to the third embodiment of the present disclosure.

Hereinafter, referring to FIGS. 11 to 13, the third embodiment of the present disclosure will be explained. At first referring to FIG. 11, the unit display panel according to the third embodiment will be explained. FIG. 11 is a plane view for illustrating a structure of a unit display panel according to the third embodiment of the present disclosure.

Comparing with the first embodiment, the unit display panel SDP according to the third embodiment may include a high level terminal VDD having a closed line as surrounding the perimeter of the substrate SUB. In addition, the unit display panel SDP may further include a low level terminal VSS having another closed line as surrounding the perimeter of the substrate SUB. The low level terminal VSS are separated from the high level terminal VDD with a predetermined distance. For example, the low level terminal VSS may be disposed at the outermost perimeter, and the high level terminal VDD may be disposed inside of the low level terminal VSS at the predetermined distance.

The low level terminal VSS and the high level terminal VSS according to the third embodiment may be a closed line having a predetermined width. The low level terminal VSS may be connected with the low voltage lines (not shown) disposed in the data pad portion 300 and the display area DA. In addition, the high level terminal VDD may be connected with the driving current lines (not shown) disposed in the data pad portion 300 and the display area DA.

According to the third embodiment, the low level terminal VSS and the high level terminal VDD may be exposed on the substrate SUB, and they may have the closed bus line shape (here, 'bus line' means a wider line than other lines) surrounding the perimeter of the substrate SUB.

Figure 13:
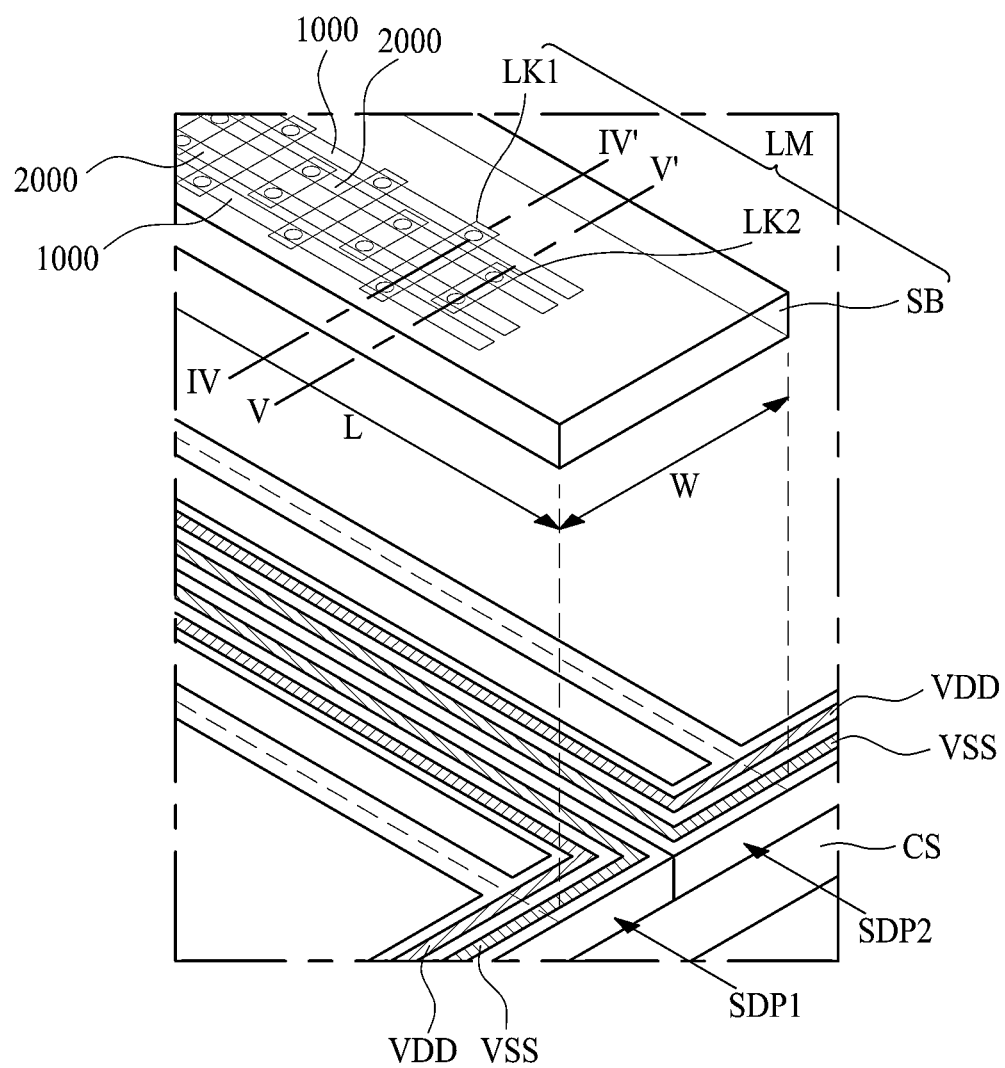
FIG. 13 is an enlarged perspective view for illustrating a structure of the joining portion in a large area display apparatus according to the third embodiment of the present disclosure.
Figure 14A:
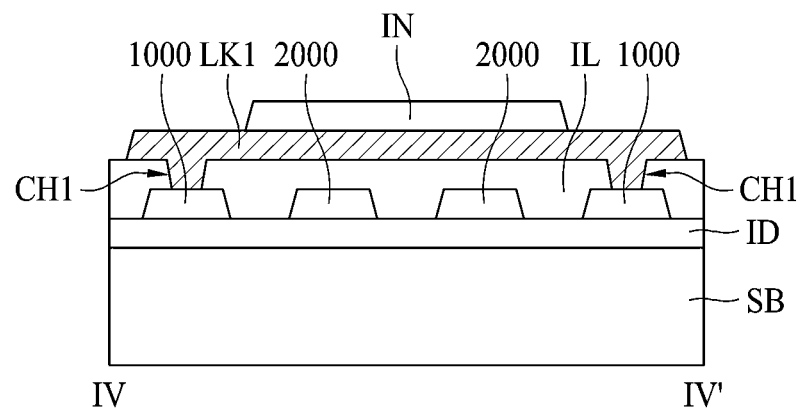
FIG. 14A is a cross-sectional view along the cutting line IV-IV' in FIG. 13.
Figure 14B:
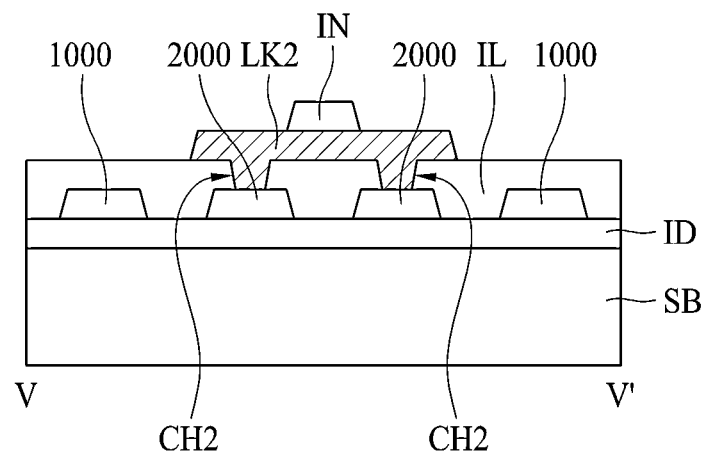
FIG. 14B is a cross-sectional view along the cutting line V-V' in FIG. 13.

Hereinafter, referring to FIGS. 12, 13, 14A and 14B, a large area display apparatus according to the third embodiment of the present disclosure will be explained. FIG. 12 is a plane view for illustrating a structure of a large area display apparatus according to the third embodiment of the present disclosure. FIG. 13 is an enlarged perspective view for illustrating a structure of the joining portion in a large area display apparatus according to the third embodiment of the present disclosure. FIG. 14A is a cross-sectional view along the cutting line IV-IV' in FIG. 13. FIG. 14B is a cross-sectional view along the cutting line V-V' in FIG. 13.

A large area display apparatus according to the third embodiment may have a structure in which a plurality of unit display panel SDP may be arrayed in a matrix manner including n rows and m columns. FIG. 12 focuses on the joining portion of the 4 unit display panels arrayed in the 2×2 matrix manner. For example, by tiling 4 unit display panels of 80 inch in the 2×2 matrix manner, a large area display apparatus of 160 inch may be configured. For another example, by tiling 64 unit display panels of 24 inch in the 8×8 matrix manner, a large area display apparatus of 192 inch may be configured.

Figure 12:
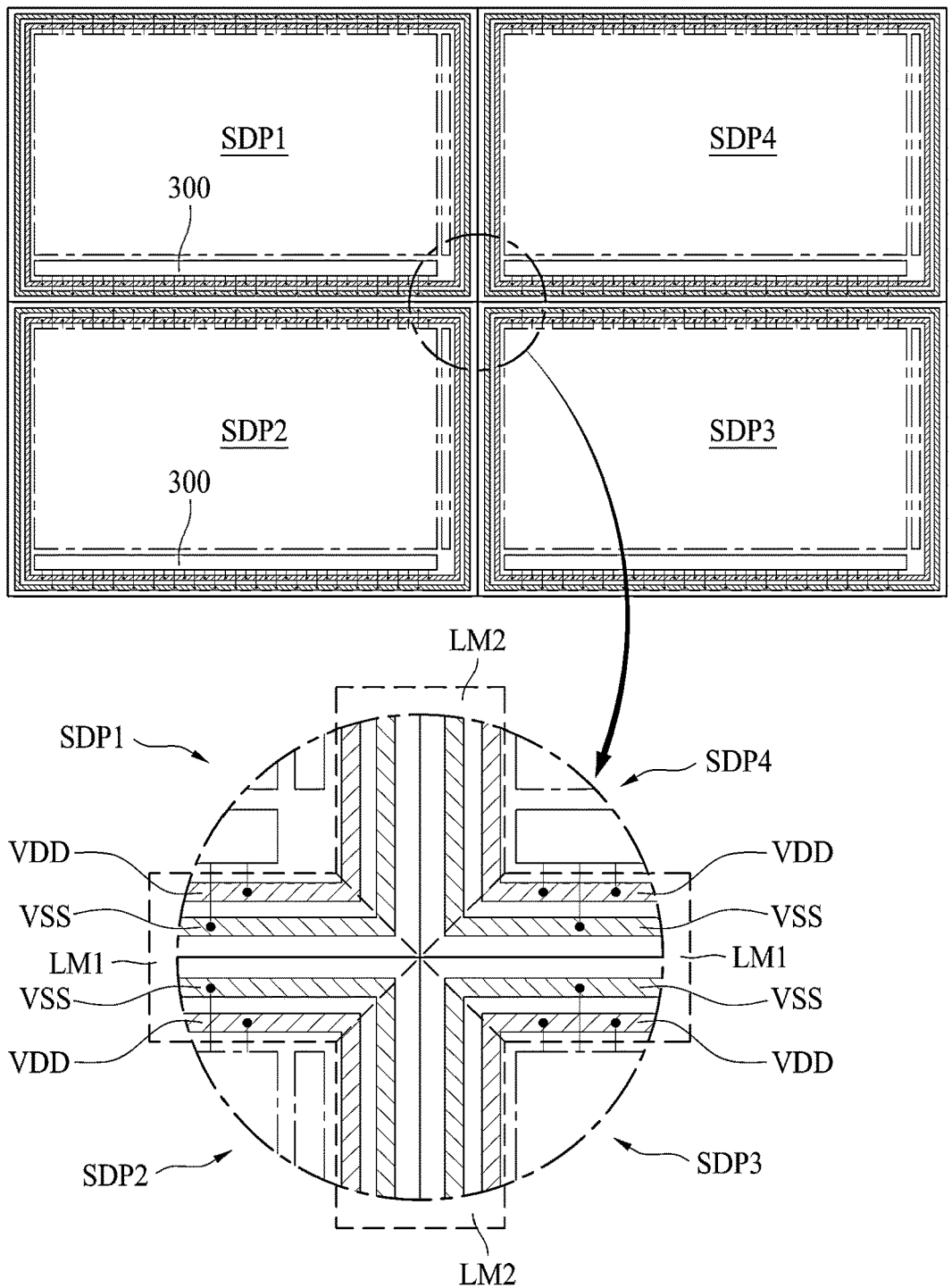
FIG. 12 is a plane view for illustrating a structure of a large area display apparatus according to the third embodiment of the present disclosure.

Referring to FIG. 12, a large area display apparatus WDP according to the third embodiment may comprise a first unit display panel SDP1, a second unit display panel SDP2, a third unit display panel SDP3 and a fourth unit display panel SDP4. Further, a connecting member LM may be disposed between the unit display panels SDP1, SDP2, SDP3 and SDP4. The connecting member LM may include a horizontal member LM1 and a vertical member LM2.

For an example, between the first unit display panel SDP1 and the second unit display panel SDP2, the horizontal member LM1 may be disposed. Between the second unit display panel SDP2 and the third unit display panel SDP3, the vertical member LM2 may be disposed. Between the third unit display panel SDP3 and the fourth unit display panel SDP4, the horizontal member LM1 may be disposed. Between the fourth unit display panel SDP4 and the first unit display panel SDP1, the vertical member LM2 may be disposed.

The horizontal members LM1 and the vertical members LM2 may be joined to each other in the 'X' shape at the point where the four unit display panels SDP1, SDP2, SDP3 and SDP4 are met. To do so, the end portion of the horizontal member LM1 and the vertical member ML2 may have bracket shape like '<' or '>'.

The cross-sectional structure of the joining portions between the first unit display panel SDP1 and the second unit display panel SDP2 may be the same as that shown in FIG. 5, so the same explanation may not be duplicated. Hereinafter, referring to FIGS. 12, 13, 14A and 14B, the assembling structure at the tiling portions in the large area display apparatus according to the third embodiment will be explained. Referring to FIG. 12, a large area display apparatus WDP according to the third embodiment may comprise 4 unit display panels SDP1, SDP2, SDP3 and SDP4 arrayed on a cover plate CS as being tiling on a same leveled plane. For example, on one surface of the cover plate CS, the data pad portion 300 of the first unit display panel SDP1 may be joined to the data pad portion 300 of the second unit display panel SDP2.

The connecting member LM may include a base SB, a lower insulating layer ID, a first extending line 1000, a second extending line 2000, an insulating layer IL, a first link line LK1, a second link line LK2 and a passivation layer IN. The base SB may be an element for connecting the unit display panels SDP1, SDP2, SDP3 and SDP4 physically and electrically, so it is preferable that the base SB may be made of rigid material. The base SB may be a thin and long plate having width W and length L. Here, the width W of the base SB may be a size for covering all of the neighboring power terminals VDD and VSS between the unit display panels SDP1, SDP2, SDP3 and SDP4. The length L of the base SB may be corresponding to one side length of the unit display panel for covering the power terminals VDD and VSS.

In detail, the horizontal member LM1 may have a length corresponding to the landscape side of the unit display panel SDP. The vertical member LM2 may have a length corresponding to the portrait side of the unit display panel.

The lower insulating layer ID may cover all surface of one side of the base SB. Especially, it is preferable that the lower insulating layer ID may cover all surface of the base SB on which the extending lines 1000 and 2000 and the link lines LK1 and LK2 are formed. For the case that the base SB is made of metal material in order to ensure the strength of the base SB, it is preferable that the lower insulating layer ID may include a highly insulative material for insulating the extending lines 1000 and 2000 and the link lines LK1 and LK2 from each other.

The first link line LK1 may be a line disposed for linking the high level terminals VDD neighboring each other. For example, the first link line LK1 may have a segment extending in a width W direction, of which one end is corresponding to the high level terminal VDD disposed at the first unit display panel SDP1, and the other end is corresponding to the high level terminal VDD disposed at the second unit display panel SDP2.

In addition, the second link line LK2 may be a line disposed for linking the low level terminals VSS neighboring each other. For example, the second line line LK2 may have a segment extending in a width W direction, of which one end is corresponding to the low level terminal VSS disposed at the first unit display panel SDP1, and the other end is corresponding to the low level terminal VSS disposed at the second unit display panel SDP2.

The first link line LK1 and the second link line LK2 may connect the high level terminals VDD and the low level terminals VSS, respectively. Therefore, it is preferable that the first link line LK1 and the second link line LK2 may be segments separated from each other.

A plurality of the first link lines LK1 may be arrayed with a first predetermined interval along the length direction. Also, a plurality of the second line lines LK2 may be arrayed with a second predetermined interval along the length direction. Here, the first link lines LK1 and the second link lines LK2 may be alternately disposed with each other. The first link lines LK1 may be connected with each other by the first extending line 1000, and the second link lines LK2 may be connected with each other by the second extending line 2000.

For example, the first extending line 1000 may be a bus line as crossing the end portions of the high level terminals VDD disposed on the lower insulating layer ID. Further, the second extending line 2000 may be a bus line as crossing the end portions of the low level terminals VSS disposed on the lower insulating layer ID. The first extending line 1000 may be separated from the second extending line 2000 with a predetermined distance.

The insulating layer IL may be formed as covering the first extending line 1000 and the second extending line 2000. A plurality of first contact holes CH1 may be formed at the insulating layer IL for exposing some portions of the first extending line. In addition, a plurality of second contact holes CH2 may be formed at the insulating layer IL for exposing some portions of the second extending line. It is preferable that the first contact holes CH1 and the second contact holes CH2 are disposed without overlapping with each other but being staggered along the width W direction.

On the insulating layer IL, the first link lines LK1 and the second link lines LK2 are disposed. The first link lines LK1 may connect, through the first contact holes CH1, two first extending lines 1000 separated from each other on the base SB. One of the first extending lines 1000 may be disposed as corresponding to the high level terminals VDD of the first unit display panel SDP1, and the other of the first extending lines 1000 may be disposed as corresponding to the high level terminals VDD of the second unit display panel SDP2. The second link lines LK2 may connect, through the second contact holes CH2, two second extending lines 2000 separated from each other on the base SB. One of the second extending lines 2000 may be disposed as corresponding to the low level terminals VSS of the first unit display panel SDP1, and the other of the second extending lines 2000 may be disposed as corresponding to the low level terminals VSS of the second unit display panel SDP2.

The passivation layer IN may cover the middle portions of the first link line LK1 and the second link line LK2, but expose both end portions. The passivation layer IN may be disposed for preventing the middle portions of the first link line LK1 and the second link line LK2 from being shorted by other conductive material or being broken by physical damages. As the first link line LK1 should be connected to the high level terminal VDD and the second link line LK2 should be connected to the low level terminal VSS, both ends of them should be exposed. For other example, a contact hole may be formed at the passivation layer and a pad may be formed therein.

The first link line LK1 may connect the high level terminal VDD of the first unit display panel SDP1 with the high level terminal VDD of the second unit display panel SDP2. Further, the first link line LK1 may cross over the low level terminal VSS of the first unit display panel SDP1 and the low level terminal VSS of the second unit display panel SDP2. Therefore, the insulating layer IN may be disposed over the first link line LK1, wherein the middle portion of the first link line LK1 may be covered by the insulating layer IN but both ends of the first link line LK1 may be exposed. In particular, it is preferable that the overlapped portions with the low level terminals VSS may be covered by the insulating layer IN.

The second link line LK2 may connect the low level terminal VSS of the first unit display panel SDP1 with the low level terminal VSS of the second unit display panel. As the low level terminals VSS of the first unit display panel SDP1 and the second unit display panel SDP2 are closely neighbored, it is preferable that the insulating layer IN may cover the middle portion of the second link line LK2 but expose the both ends.

Here, the insulating layer IN may have wider width over the first link line LK1 and narrower width over the second link line LK2. Due to the thickness of the insulating layer IN, the first link line LK1 and the second link line LK2 may have a shape as sinking down from the insulating layer IN. However, when connecting the first link line LK1 to the high level terminal VDD and the second link line LK2 to the low level terminal VSS using an anisotropy conductive film ACF, there may be no contact problem. When it is required, in order to ensure the contact ability, upper terminals may be further formed at both ends of the first link lines LK1 and the second link line LK2 exposed from the insulating layer IN.

Figure 15A:
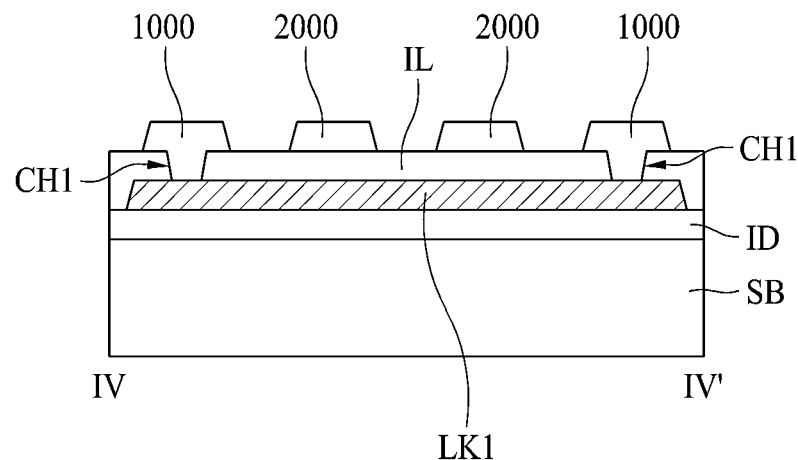
FIG. 15A is a cross-sectional view according to another example along the cutting line IV-IV' in FIG. 13.
Figure 15B:
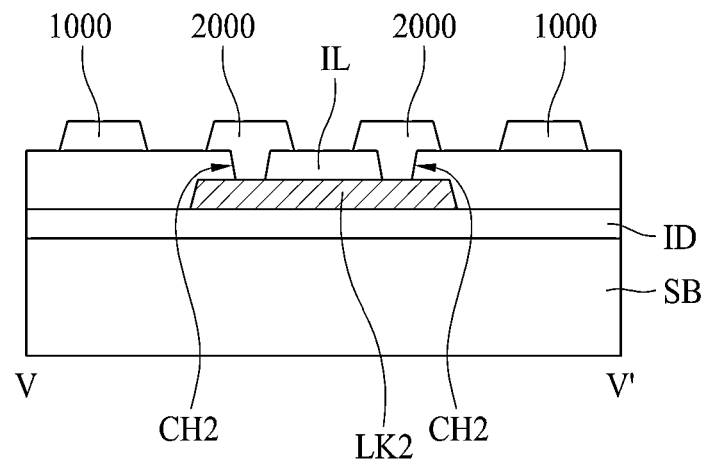
FIG. 15B is a cross-sectional view according to another example along the cutting line V-V' in FIG. 13.

For another example, the connecting member LM may have structures as shown in FIGS. 15A and 15B. FIG. 15A is a cross-sectional view according to another example along the cutting line Iv-Iv' in FIG. 13. FIG. 15B is a cross-sectional view according to another example along the cutting line V-V' in FIG. 13.

By comparing with FIGS. 14A and 14B, FIGS. 15A and 15B show that the first link line LK1 and the second link line LK2 may be disposed under the first extending line 1000 and the second extending line 2000. The connecting member LM may include a base SB, a lower insulating layer ID, a first link line LK1, a second link line LK2, an insulating layer IL, a first extending line 1000 and a second extending line 2000.

The lower insulating layer ID may be deposited on the base SB. The first link line LK1 and the second link line LK2 may be disposed on the lower insulating layer ID. The first link line LK1 may connect two first extending lines 1000 neighboring but separated from each other in the tiling structure. The second link line LK2 may connect two second extending lines 2000 neighboring but separated from each other in the tiling structure.

The first link line LK1 and the second link line LK2 may extend as crossing over the width W of the base SB. A plurality of the first link lines LK1 and a plurality of the second link lines LK2 may be arrayed along the length L direction on the base SB with a predetermined distance.

The insulating layer IL may be deposited on the surface of the base SB where the first link line LK1 and the second link line LK2 are formed. First contact holes CH1 may be formed at the insulating layer IL to expose both ends of the first link line LK1. Further, second contact holes CH2 may be formed at the insulating layer IL to expose both ends of the second link line LK2.

The first extending line 1000 may be formed on the insulating layer IL. The first extending line 1000 may have a segment shape facing with the high level terminal VDD of the first unit display panel SDP1. The first extending line 1000 may connect with one end of the first link line LK1 through the first contact hole CH1. It is preferable that the first extending line 1000 may have a segment shape to connect each of the one ends of the first link lines LK1.

Further, each of the other ends of the first link lines LK1 may be connected to the first extending line 1000 having a segment shape facing with the high level terminal VDD of the second unit display panel SDP2. The first extending lines 1000 of the first unit display panel SDP1 and the second unit display panel SDP2 are separated from each other, but they are connected with each other via the first link lines LK1.

These two first extending lines 1000 are connected with each other as corresponding to high level terminals VDD of the first unit display panel SDP1 and the second unit display panel SDP2, respectively. That is, the high level terminal VDD of the first unit display panel SDP1 and the high level terminal VDD of the second unit display panel SDP2 are electrically connected with each other via the first link lines LK1.

Likewise, the second extending line 2000 may be formed on the insulating layer IL. The second extending line 2000 may have a segment shape facing with the low level terminal VSS of the first unit display panel SDP1. The second extending line 2000 may connect with one end of the second link line LK2 through the second contact hole CH2. It is preferable that the second extending line 2000 may have a segment shape to connect each of the one ends of the second link lines LK2.

Further, each of the other ends of the second link lines LK2 may be connected to the second extending line 2000 having a segment shape facing with the low level terminal VSS of the second unit display panel SDP2. The second extending lines 2000 of the first unit display panel SDP1 and the second unit display panel SDP2 are separated from each other, but they are connected with each other via the second link lines LK2.

These two second extending lines 2000 are connected with each other as corresponding to low level terminals VSS of the first unit display panel SDP1 and the second unit display panel SDP2, respectively. That is, the low level terminal VSS of the first unit display panel SDP1 and the low level terminal VSS of the second unit display panel SDP2 are electrically connected with each other via the second link lines LK2.

In the example referring to FIGS. 15A and 15B, the first extending line 1000 and the second link line 2000 are connected to the high level terminal VDD and the low level terminal VSS, respectively. Therefore, the passivation layer may not be required.

The present disclosure provides a structure in which a plurality of unit display panels SDP are assembled in a matrix manner, and the power terminals VDD and VSS are connected to each other as they are connected with the connecting member LK. That is, the high level terminals VDD of each unit display panel SDP are electrically connected with each other, and each of the low level terminals VSS of each unit display panel SDP are also electrically connected each other. Accordingly, the high level terminals VDD and the low level terminals VSS maintain a constantly uniformed level of the voltage, respectively.

As the brightness or luminance of pixels in the organic light emitting diode display may be defined by the selected voltage between the high level voltage and the low level voltage, the luminance or brightness of the same video data may not be different among the unit display panels when the high level voltage and the low level voltage are uniformly applied to the unit display panels. According to the first embodiment of the present disclosure, all low level terminals of the unit display panels are connected and all high level terminals of the unit display panels are connected, so that the same low level voltage and the same high level voltage may be supplied over all unit display panels without voltage drop-down problem. Accordingly, the present disclosure may provide excellent display quality without difference or variations in luminance or brightness in realizing a large area display apparatus by tiling a plurality of unit display panel in a matrix manner.

Figure 16:
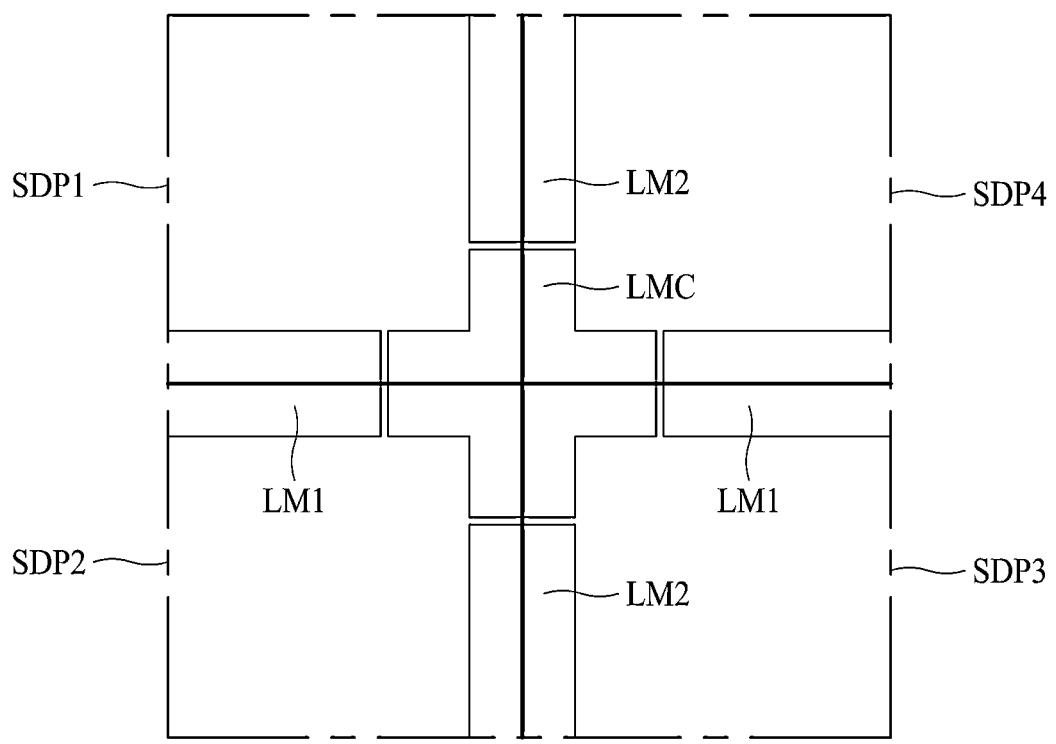
FIG. 16 is a plan view for illustrating another example of a connecting member for connecting the plurality of unit display panels according to the present disclosure.

Hereinafter, referring to FIG. 16, another structure of a connecting member for joining the unit display panel will be explained. FIG. 16 is a plan view for illustrating another example of a connecting member for connecting the plurality of unit display panels according to the present disclosure.

In the large area display apparatus explained above, the connecting member may have a bracket shape such as '<' or '>'. However, embodiments are not limited thereto. For example, as shown in FIG. 16, the connecting member LM may include a horizontal member LM1, a vertical member LM2 and a center member LMC.

The horizontal member LM1 and the vertical member LM2 may have a rod shape disposed between two neighboring sides of the unit display panels SDP. For example, the horizontal member LM1 may be disposed between two unit display panels SDP arrayed in the column direction, and have a length and width for covering the power terminals VDD and VSS. The vertical member LM2 may be disposed between two unit display panels SDP arrayed in the row direction, and have a length and width for covering the power terminals VDD and VSS.

The center member LMC may be disposed at the crossing corner position where 4 unit display panels SDP are joined, and have a '+' shape to be arranged with the horizontal member LM1 and the vertical member LM2. The center member LMC may not have any electrical link element such as the link line. The center member LMC may include a fastening element (not shown) for assembling the horizontal member LM1 and the vertical member LM2 not to be removed.

Features, structures, effects and so on described in the above described examples of the present disclosure are included in at least one example of the present disclosure, and are not necessarily limited to only one example. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. A unit display panel, comprising:
    a substrate;
    a display area defined at a middle portion of the substrate and a non-display area around the display area;
    a pad portion disposed at the non-display area;
    an emission layer disposed in the display area on the substrate; and
    a plurality of power terminals disposed outside the pad portion in the non-display area,
    wherein the plurality of power terminals are disposed on the outermost side of the substrate and are configured to supply voltage for driving the emission layer.

2. The unit display panel according to claim 1, wherein the power terminals include:
    a first terminal connected to a low level pad in the pad portion; and
    a second terminal connected to a high level pad in the pad portion.

3. The unit display panel according to claim 2, wherein the first terminal is divided into a plurality of first terminals which are arrayed with a predetermined distance on at least one side of the substrate, and
    wherein the second terminal is divided into a plurality of second terminals which are arrayed between two neighboring first terminals.

4. The unit display panel according to claim 3, wherein at least one pair of the first terminal and the second terminal are disposed on each of four sides of the substrate.

5. The unit display panel according to claim 2, wherein the first terminal is disposed along a perimeter of the substrate, and
    wherein the second terminal is parallel to the first terminal.

6. The unit display panel according to claim 5, wherein the first terminal has a closed line along the perimeter of the substrate, and the second terminal has another closed line along the perimeter of the substrate.

7. The unit display panel according to claim 1, further comprising:
    an encapsulation layer covering the emission layer;
    a circuit board including a timing controller and disposed on the encapsulation layer; and
    a flexible film including a source driving integrated circuit, of which one side is connected to the circuit board and other side is connected to the pad portion.

8. A large area display apparatus, comprising:
    a cover plate;
    a plurality of unit display panels arrayed on one surface of the cover plate, each of the unit display panels includes:
    a substrate;
    a display area defined at middle portions of the substrate;
    a non-display area around the display area;
    a pad portion disposed in the non-display area;
    a first terminal disposed outside the pad portion in the non-display area; and
    a second terminal apart from the first terminal disposed outside the pad portion in the non-display area; and
    a connecting member disposed between two unit display panels, the connecting member connecting the first terminals of the unit display panels and the second terminals of the unit display panels, respectively.

9. The large area display apparatus according to claim 8, wherein the plurality of unit display panels are arrayed in a matrix manner including n rows and m columns (here, n and m are natural number larger than 1), and
    wherein the connecting member includes:
    a first member disposed between two unit display panels neighboring in a column direction; and
    a second member disposed between two unit display panels neighboring in a row direction.

10. The large area display apparatus according to claim 9, wherein the first member and the second member include:
    a first link line connecting the first terminals of the neighboring two unit display panels; and
    a second link line connecting the second terminals of the neighboring two unit display panels, and electrically separated from the first terminals.

11. The large area display apparatus according to claim 9, wherein the first member and the second member are assembled with 'X' shape at a corner where four unit display panels are joined.

12. The large area display apparatus according to claim 9, wherein the first member and the second member have a rod shape disposed between the neighboring two unit display panels, and
- wherein the connecting member further includes:
- a center member fastening with the first member and the second member as having '+' shape and disposing at a corner where four unit display panels are joined.

13. The large area display apparatus according to claim 8, wherein the first terminal is divided into a plurality of first terminals which are arrayed with a predetermined distance on at least one side of the substrate,
- wherein the second terminal is divided into a plurality of second terminals which are arrayed between two neighboring first terminals, and
- wherein the connecting member includes:
- a base having a width and a length;
- a first link line extended from one end to other end crossing the width as corresponding to the first terminal;
- a second link line extended from the one end to the other end crossing the width as corresponding to the second terminal; and
- a passivation layer covering a middle of the first link line and the second link line and exposing both ends of the first link line and the second link line.

14. The large area display apparatus according to claim 8, wherein the first terminal is disposed along a perimeter of the substrate,
- wherein the second terminal is disposed as parallel with the first terminal,
- wherein the connecting member includes:
- a base having a width and a length;
- a first link line extended from one end to other end crossing the width as corresponding to the first terminal on the base;
- an insulating layer covering the first link line and exposing both ends of the first link line;
- a second link line extended from the one end to the other end crossing the width as corresponding to the second terminal on the insulating layer; and
- a passivation layer covering the second link line and exposing both ends of the first link line and the second link line.

15. The large area display apparatus according to claim 14, further comprising:
- a first extending line crossing the length for connecting both ends of the first link line, and corresponding to the first terminal under the insulating layer; and
- a second extending line crossing the length for connecting both ends of the second link line, and corresponding to the second terminal under the insulating layer.

* * * * *